US010224220B2

(12) United States Patent
Ozu et al.

(10) Patent No.: US 10,224,220 B2
(45) Date of Patent: *Mar. 5, 2019

(54) PLASMA PROCESSING APPARATUS AND PLASMA ETCHING APPARATUS

(71) Applicant: TOKYO ELECTRON LIMITED, Tokyo (JP)

(72) Inventors: Toshihisa Ozu, Amagasaki (JP); Naoki Matsumoto, Amagasaki (JP); Takashi Tsukamoto, Amagasaki (JP); Kazuto Takai, Amagasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 729 days.

This patent is subject to a terminal disclaimer.

(21) Appl. No.: 14/287,537

(22) Filed: May 27, 2014

(65) Prior Publication Data

US 2014/0262025 A1  Sep. 18, 2014

Related U.S. Application Data

(62) Division of application No. 13/391,196, filed as application No. PCT/JP2010/063543 on Aug. 10, 2010, now Pat. No. 8,771,537.

(30) Foreign Application Priority Data

Aug. 20, 2009 (JP) .................. 2009-191354
Aug. 20, 2009 (JP) .................. 2009-191355

(51) Int. Cl.
*C23C 16/455* (2006.01)
*H01J 37/32* (2006.01)
(Continued)

(52) U.S. Cl.
CPC ...... *H01L 21/67069* (2013.01); *C23C 16/455* (2013.01); *C23C 16/45523* (2013.01);
(Continued)

(58) Field of Classification Search
CPC ........ C23C 16/45561; C23C 16/45565; C23C 16/4558; C23C 16/52;
(Continued)

(56) References Cited

U.S. PATENT DOCUMENTS 6,829,056 B1 * 12/2004 Barnes .............. H01J 37/32935
118/708
8,771,537 B2 * 7/2014 Ozu .................... H01J 37/3244
216/67
(Continued)

FOREIGN PATENT DOCUMENTS

JP  2666768  6/1997
JP  2006041088  2/2006
(Continued)

OTHER PUBLICATIONS

International Search Report—PCT/JP2010/063543 dated Oct. 19, 2010.
(Continued)

*Primary Examiner* — Jeffrie R Lund
*Assistant Examiner* — Stanislav Antolin
(74) *Attorney, Agent, or Firm* — Cantor Colburn LLP

(57) ABSTRACT

Uniformity of a plasma process on a surface of a substrate is to be improved. In a plasma processing apparatus that processes a substrate by generating plasma from a processing gas introduced in a processing container, a ratio between an introducing amount of the processing gas introduced to a center portion of the substrate received in the processing container and an introducing amount of the processing gas introduced to a peripheral portion of the substrate received
(Continued)

in the processing container is changed during a plasma process. Accordingly, a variation in an etching rate or the like between the center portion and the peripheral portion of the substrate may be reduced. Therefore, uniformity of the plasma process on the surface of the substrate is improved.

5 Claims, 12 Drawing Sheets

(51) Int. Cl.
    *H01L 21/3065* (2006.01)
    *H01L 21/311* (2006.01)
    *H01L 21/3213* (2006.01)
    *H01L 21/67* (2006.01)

(52) U.S. Cl.
    CPC .... *C23C 16/45561* (2013.01); *H01J 37/3244* (2013.01); *H01J 37/32449* (2013.01); *H01L 21/30655* (2013.01); *H01L 21/31116* (2013.01); *H01L 21/31138* (2013.01); *H01L 21/32137* (2013.01); *H01J 2237/334* (2013.01)

(58) Field of Classification Search
    CPC ......... C23C 14/24–14/26; C23C 14/54; C23C 16/045; C23C 16/06–16/08; C23C 16/4482; C23C 16/448–16/452; C23C 16/45502–16/4551; C23C 16/45523–16/4555; C23C 16/45527; C23C 16/45557; H01J 37/3244; H01J 37/32449; H01J 37/32009; H01L 21/31116; H01L 21/32137; H01L 21/67069; H01L 21/02148; H01L 21/02181; H01L 21/0228; H01L 21/02312–21/02315; H01L 21/28194; H01L 21/3065; H01L 21/31138; H01L 21/3141–21/3142; H01L 21/32136
    See application file for complete search history.

(56) References Cited

U.S. PATENT DOCUMENTS

| | | | |
|---|---|---|---|
| 2002/0014471 A1* | 2/2002 | Donohoe ............ | C23C 16/4405 216/67 |
| 2002/0042205 A1* | 4/2002 | McMillin .................. | C23F 4/00 438/710 |
| 2003/0005958 A1* | 1/2003 | Rocha-Alvarez .... | G05D 7/0635 137/118.01 |
| 2003/0155079 A1* | 8/2003 | Bailey, III ........ | H01J 37/32449 156/345.49 |
| 2004/0112540 A1* | 6/2004 | Larson .................. | G05D 7/0664 156/345.33 |
| 2004/0168719 A1* | 9/2004 | Nambu ................. | G05D 7/0664 137/87.04 |
| 2004/0200529 A1* | 10/2004 | Lull ...................... | G05D 7/0664 137/487.5 |
| 2005/0005994 A1* | 1/2005 | Sugiyama ............ | G05D 7/0664 141/4 |
| 2005/0199342 A1* | 9/2005 | Shajii ................. | C23C 16/45561 156/345.26 |
| 2006/0000803 A1* | 1/2006 | Koshiishi .......... | H01J 37/32082 216/67 |
| 2006/0016559 A1 | 1/2006 | Kobayashi et al. | |
| 2006/0042754 A1 | 3/2006 | Yoshida et al. | |
| 2006/0066247 A1* | 3/2006 | Koshiishi .......... | H01J 37/32018 315/111.21 |
| 2006/0213864 A1 | 9/2006 | Tahara et al. | |
| 2006/0219363 A1* | 10/2006 | Matsumoto ................ | C23F 4/00 156/345.47 |
| 2006/0237063 A1* | 10/2006 | Ding .................... | G05D 11/132 137/487.5 |
| 2007/0010099 A1 | 1/2007 | Du et al. | |
| 2007/0056929 A1* | 3/2007 | Miya .................. | H01J 37/32449 216/67 |
| 2007/0066038 A1* | 3/2007 | Sadjadi ............. | H01J 37/32091 438/478 |
| 2007/0151668 A1* | 7/2007 | Mizusawa ......... | C23C 16/45557 156/345.29 |
| 2007/0186983 A1* | 8/2007 | Ding .................... | G05D 11/132 137/487.5 |
| 2007/0241454 A1* | 10/2007 | Chen ................. | H01L 21/68735 257/724 |
| 2007/0249173 A1* | 10/2007 | Kim .................. | H01J 37/32091 438/711 |
| 2007/0251642 A1 | 11/2007 | Bera et al. | |
| 2007/0251918 A1 | 11/2007 | Bera et al. | |
| 2007/0256626 A1* | 11/2007 | Kawanishi .............. | C30B 25/02 117/85 |
| 2008/0115834 A1* | 5/2008 | Geoffrion ............ | G05D 11/132 137/9 |
| 2008/0202610 A1* | 8/2008 | Gold .................. | H01J 37/3244 137/597 |
| 2008/0261406 A1 | 10/2008 | Iijima et al. | |
| 2008/0271762 A1* | 11/2008 | Park ..................... | G05D 11/132 134/98.1 |
| 2009/0061640 A1 | 3/2009 | Wong et al. | |
| 2009/0095364 A1* | 4/2009 | Itoh .................. | C23C 16/45523 137/861 |
| 2009/0221149 A1* | 9/2009 | Hammond, IV .... | H01J 37/3244 438/706 |
| 2009/0272717 A1* | 11/2009 | Pamarthy .......... | H01L 21/30655 216/37 |
| 2010/0084023 A1* | 4/2010 | Melcer .................... | B24B 37/04 137/14 |
| 2010/0101728 A1* | 4/2010 | Iwasaki ............. | H01J 37/32192 156/345.33 |
| 2011/0220609 A1* | 9/2011 | Yaegashi ........... | H01J 37/32091 216/12 |
| 2011/0265883 A1* | 11/2011 | Cruse ................. | H01J 37/3244 137/8 |

FOREIGN PATENT DOCUMENTS

| | | |
|---|---|---|
| JP | 2006066855 | 3/2006 |
| JP | 2007149559 | 6/2007 |
| JP | 2007300102 | 11/2007 |
| JP | 2008085165 | 4/2008 |
| JP | 2008166853 | 7/2008 |
| JP | 2008251660 | 10/2008 |
| JP | 2009099807 | 5/2009 |
| JP | 2009117477 | 5/2009 |
| TW | 200624591 | 7/2006 |
| TW | 200802599 | 1/2008 |
| TW | 200919581 | 5/2009 |
| WO | WO 2008123605 A1 * | 10/2008 ........ H01J 37/32192 |

OTHER PUBLICATIONS

PCT International Preliminary Report on Patentability—PCT/JP2010/063543 dated Mar. 13, 2012.

* cited by examiner

<Comparative Example>

<Comparative Example>

<Comparative Example>

PLASMA PROCESSING APPARATUS AND PLASMA ETCHING APPARATUS

CROSS-REFERENCE TO RELATED PATENT APPLICATIONS

This application is a divisional application of U.S. application Ser. No. 13/391,196, filed on Apr. 5, 2012, which is a U.S. national phase entry of PCT/JP2010/063543 filed on Aug. 10, 2010 and claims a priority to and the benefit of Japanese Patent Application No. 2009-191354, filed on Aug. 20, 2009 and Japanese Patent Application No. 2009-191355, filed on Aug. 20, 2009, the disclosures of which are incorporated herein in its entirety by reference.

BACKGROUND OF THE INVENTION

1. Field of the Invention

The present invention relates to a plasma processing apparatus and a plasma processing method used for manufacturing semiconductors.

2. Description of the Related Art

Conventionally, in field of manufacturing semiconductor devices, methods of performing a process, such as an etching process or a film-forming process, by using plasma have been adopted. As one of the methods, a radial line slot antenna (RLSA) type plasma processing apparatus that generates plasma by propagating microwaves from a slot formed in a radial line slot plate into a processing container is well known (for example, refer to Patent Document 1). An RLSA type plasma processing apparatus has an advantage of performing a plasma process on a large-sized semiconductor wafer evenly and rapidly, because plasma of low electron temperature may be evenly generated at a high density. As an example of the plasma process, a process of etching of a substrate surface performed by using an HBr gas is well known. As another example of the plasma process, a process of etching an SiN film formed on a surface of a substrate by using a processing gas including a $CF_4$ gas and a $CHF_3$ gas is well known.

In an RLSA type plasma processing apparatus, microwaves are propagated inside a processing container via a dielectric disposed on a ceiling surface of the processing container. A processing gas introduced in the processing container becomes plasma due to energy of the microwaves, and a surface of a substrate is processed. In general, an introduction unit for introducing the processing gas into the processing container is disposed, for example, in a side surface of the processing container. Recently, an introduction unit for introducing the processing gas has been provided in a ceiling surface of the processing container, in addition to the introduction unit disposed in the side surface of the processing container (for example, refer to Patent Document 2).

Patent Document 3 discloses a parallel plate type plasma processing apparatus. In the parallel plate type plasma etching apparatus, a pair of an upper electrode and a lower electrode that are parallel with each other are provided in a processing container, a radio frequency is applied to the lower electrode, and at the same time, a substrate is placed on the lower electrode to be etched. In order to improve uniformity within a surface of the etched substrate, the upper electrode is divided into a center region for supplying a processing gas to a center of the substrate, and a peripheral region for supplying the processing gas to a peripheral portion of the substrate. In addition, a ratio between introducing amounts of the processing gas to the center portion and the peripheral portion is controlled (Radial distribution control (RDC)).

3. Prior Art Reference (Patent Document 1) Japanese Laid-open Patent Publication No. 2009-99807
(Patent Document 2) Japanese Laid-open Patent Publication No. 2008-251660
(Patent Document 3) Japanese Laid-open Patent Publication No. 2009-117477

SUMMARY OF THE INVENTION

Technical Problem

Here, in a radial line slot antenna (RLSA) type plasma processing apparatus disclosed in Patent Document 2, improvement of uniformity of a plasma process with respect to a surface of a substrate has been promoted by optimizing a ratio between introducing amounts of a processing gas from an introduction unit formed on a side surface and an introducing unit formed in a ceiling surface. In addition, the plasma process has been performed while maintaining the optimized ratio of the introducing amounts during the process. However, even if the ratio of the introducing amounts of the processing gas is optimized, it was difficult to perform the plasma process on the surface of the substrate uniformly because etching rates or the like on a center portion of the substrate and on a peripheral portion of the substrate are different from each other.

Meanwhile, an accurate control of a critical dimension (CD) of an etching is necessary in order to form super-fine patterns recently. Thus, in processes requiring strict CD control such as processes of forming a mask opening, a spacer, a gate, or the like, a CD value after the etching is measured by an optical inspection apparatus in order to check various factors contributing to the CD value. However, a method of easily controlling the CD value in the etching has not been established yet.

In addition, in a parallel plate type plasma processing apparatus disclosed in Patent Document 3, plasma generated between an upper electrode and a lower electrode separated in a short distance within 40 mm from each other is used, and electron temperature of the plasma is maintained high throughout from the upper electrode to the lower electrode. Also, a common gas and an additive gas are all introduced to the upper electrode, and thus it may not variously control dissociation of the common gas and the additive gas.

Technical Solution

According to an aspect of the present invention, there is provided a plasma processing apparatus which processes a substrate by generating plasma from a processing gas introduced into a processing container, the plasma processing apparatus including: a central introduction unit which introduces the processing gas onto a center portion of the substrate received in the processing container; a peripheral introduction unit which introduces the processing gas onto a peripheral portion of the substrate received in the processing container; a splitter which variably adjusts flow rates of the processing gas supplied to the central introduction unit and the peripheral introduction unit; and a controller which controls the splitter, wherein the controller may control the splitter to change a ratio between an introducing amount of the processing gas from the central introduction unit and an introducing amount of the processing gas from the peripheral introduction unit during the plasma process.

According to another aspect of the present invention, there is provided a plasma processing method which processes a substrate by generating plasma from a processing gas introduced in a processing container, the plasma processing method including changing a ratio between an introducing amount of the processing gas introduced onto a center portion of the substrate received in the processing container and an introducing amount of the processing gas introduced onto a peripheral portion of the substrate received in the processing container, during a plasma process.

According to another aspect of the present invention, there is provided a plasma processing apparatus for etching a substrate by introducing a processing gas, in which a plurality of material gases are mixed, into a processing container and generating plasma from the processing gas in the processing container, the plasma processing apparatus including: a plurality of source gas supplying units which supply raw material gases that are different from each other; and a controller which controls supplied amounts of the material gases from the material gas supplying units.

According to another aspect of the present invention, there is provided a plasma processing method for etching a substrate by introducing a processing gas, in which a plurality of material gases are mixed, into a processing container and generating plasma from the processing gas in the processing container, the plasma processing method including changing a mixture ratio of the material gases that are different from each other to control a critical dimension (CD).

Advantageous Effects

According to the present invention, a ratio between an introducing amount of a processing gas introduced to a center portion of a substrate and an introducing amount of the processing gas introduced to a peripheral portion of the substrate is changed during a plasma process. Accordingly, a variation in an etching rate or the like between the center portion and the peripheral portion of the substrate may be reduced. Therefore, uniformity of the plasma process on the surface of the substrate may be improved.

Also, according to the present invention, a ratio of supplying amounts of material gases such as a $CF_4$ gas or a $CHF_3$ gas included in the processing gas may be changed in order to control a critical dimension (CD) of an etching. In addition, processes for forming a mask opening, a spacer, a gate, or the like, which require strict CD control, may be performed easily.

EXPLANATION ON REFERENCE NUMERALS

Figure 1:
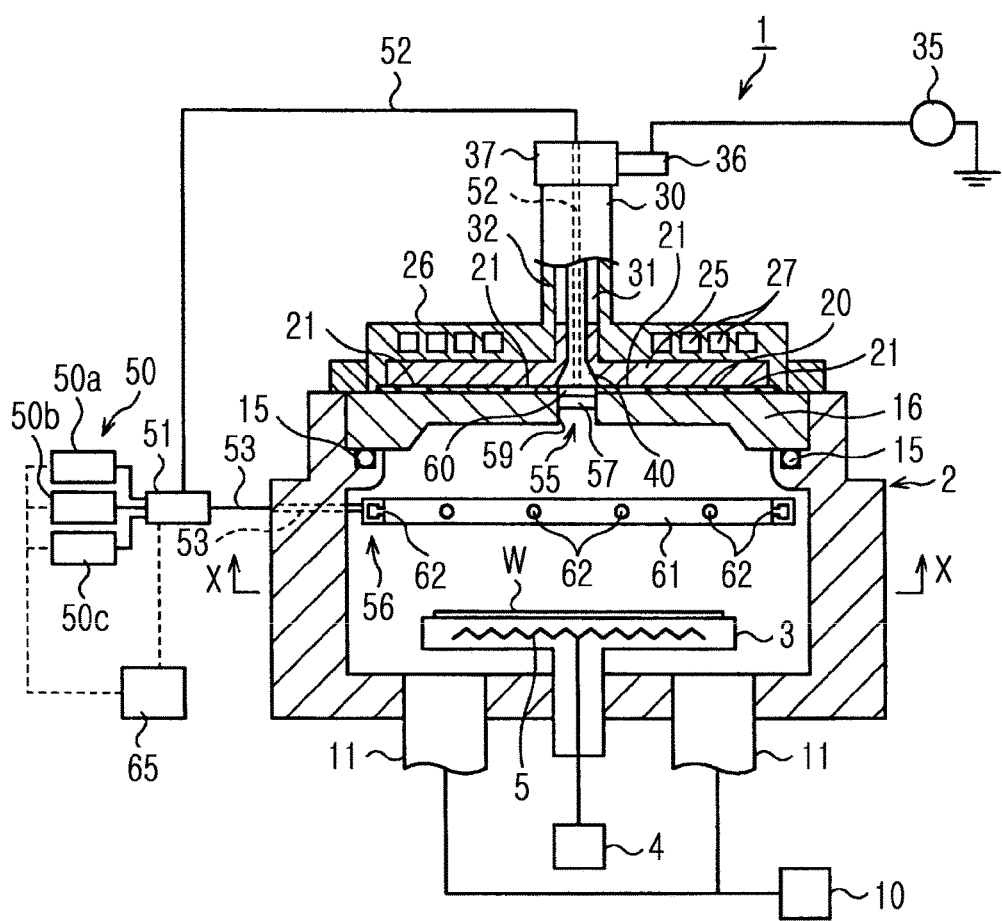
FIG. 1 is a longitudinal-sectional view schematically showing a plasma processing apparatus according to an embodiment of the present invention.

W: wafer
1: plasma processing apparatus
2: processing container
3: susceptor
4: external power
5: heater
10: exhaust apparatus
16: dielectric window
20: radial line slot plate
25: dielectric plate
30: coaxial waveguide
31: internal conductor
32: external conductor
35: microwave supply apparatus
36: rectangular waveguide
50, 50': gas supply source
50a: Ar gas supplying unit
50b: HBr gas supplying unit
50c: $O_2$ gas supplying unit
50' a: Ar gas supplying unit
50' b: $CF_4$ gas supplying unit
50' c: $CHF_3$ gas supplying unit
51: splitter
52, 53: supplying passage
55: central introduction unit
56: peripheral introduction unit
57: injector block
61: injector ring
65: controller

DETAILED DESCRIPTION OF THE INVENTION

Hereinafter, embodiments of the present invention will be described with reference to accompanying drawings. In addition, in the present specification and drawings, like reference numerals denote like components, and descriptions about the same components are not provided.

As shown in FIG. 1, a plasma processing apparatus 1 according to an embodiment of the present invention includes a processing container 2 formed as a cylinder. An upper portion of the processing container 2 is open, and a bottom portion of the processing container 2 is blocked. The processing container 2 is formed of, for example, aluminum, and electrically grounded. An inner wall surface of the processing container 2 is coated with a protective film, for example, alumna.

A susceptor 3 that is a holding stage on which a substrate, for example, a semiconductor wafer (hereinafter, referred to as a wafer) W, is placed is provided on a bottom portion in the processing container 2. The susceptor 3 is formed of, for example, aluminum, and a heater 5 generating heat on receiving electric power supplied from an external power source 4 is provided in the susceptor 3. The wafer W on the susceptor 3 may be heated to a predetermined temperature by the heater 5.

An exhaust pipe 11 is connected to the bottom portion of the processing container 2 in order to exhaust an inner atmosphere of the processing container 2 by using an exhaust apparatus 10 such as a vacuum pump.

Figure 2:
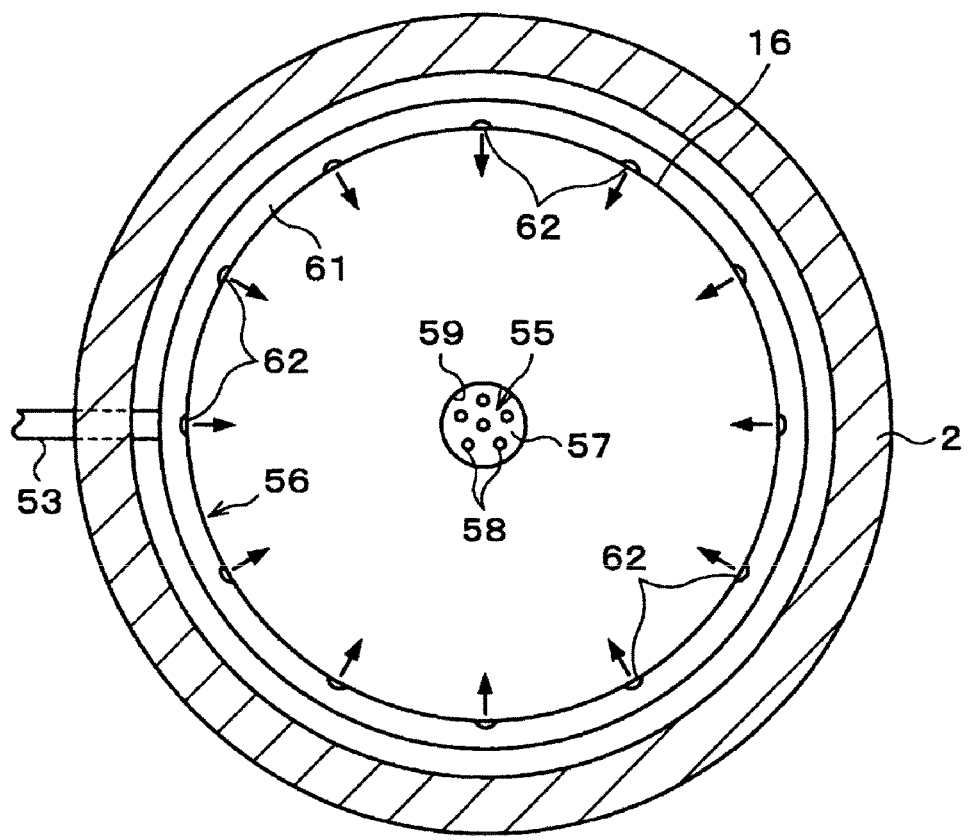
FIG. 2 is a cross-sectional view taken along line X-X of FIG. 1, and showing a state of a lower surface of a dielectric window.

A dielectric window 16 formed of a dielectric material, for example, quartz, is provided on an upper portion of the processing container 2 via a sealing material 15 such as an O-ring for ensuring hermetical property. As shown in FIG. 2, the dielectric window 16 is formed approximately as a disc. The dielectric window 16 may be formed of another dielectric material, for example, ceramics such as $Al_2O_3$ or AlN, instead of quartz.

A slot plate of a flat plate type, for example, a radial line slot plate 20 formed as a disc, is provided on an upper portion of the dielectric window 16. The radial line slot plate 20 is formed of a thin copper disc that is plated or coated with a conductive material, for example, Ag or Au. A plurality of slots 21 are arranged in the radial line slot plate 20 in a plurality of concentric circle shape.

A dielectric plate 25 for reducing wavelength of a microwave is disposed on an upper surface of the radial line slot plate 20. The dielectric plate 25 is formed of a dielectric material, for example, $Al_2O_3$. Instead of $Al_2O_3$, another dielectric material, for example, ceramics such as quartz or AlN, may be used to form the dielectric plate 25. The dielectric plate 25 is covered by a conductive cover 26. A heat medium path 27 of a circular loop type is formed in the cover 26, and the cover 26 and the dielectric window 16 are maintained at a predetermined temperature by a heat medium flowing in the heat medium path 27.

A coaxial waveguide 30 is connected to a center portion of the cover 26. The coaxial waveguide 30 consists of an internal conductor 31 and an external conductor 32. The internal conductor 31 is connected to an upper center portion of the radial line slot plate 20 that is described above after penetrating through a center of the dielectric plate 25. The plurality of slots 21 formed in the radial line slot plate 20 are arranged in a plurality of circumferences that are all formed based on the internal conductor 31 as a center.

A microwave supply apparatus 35 is connected to the coaxial waveguide 30 via a rectangular waveguide 36 and a mode converter 37. A microwave having a frequency of, for example, 2.45 GHz, generated by the microwave supply apparatus 35 is irradiated to the dielectric window 16 via the rectangular waveguide 36, the mode converter 37, the coaxial waveguide 30, the dielectric plate 25, and the radial line slot plate 20. In addition, an electric field is generated on a lower surface of the dielectric window 16 by the microwave, and then plasma is generated in the processing container 2.

A lower end 40 of the internal conductor 31 that is connected to the radial line slot plate 20 is formed as a circular truncated cone. As described above, since the lower end 40 of the internal conductor 31 is formed as the circular truncated cone, the microwaves may be propagated efficiently from the coaxial waveguide 30 toward the dielectric plate 25 and the radial line slot plate 20.

The microwave plasma generated by the above structure is characterized in that plasma having a relatively high electron temperature of about a few eV and generated right under the dielectric window 16 (referred to as plasma excitation region) is diffused, and the plasma becomes to have a relatively low electron temperature of about 1 to 2 eV right above the wafer W (plasma diffusion region). That is, unlike the plasma generated in the parallel plate type plasma processing apparatus or the like, distribution of the electron temperature of the plasma is accurately set as a distance function from the dielectric window 16. In more detail, according to a distance function from a portion right under the dielectric window 16, the electron temperature of about a few eV to about 10 eV right under the dielectric window 16 is attenuated to about 1 to 2 eV on the wafer W. The process of the wafer W is performed on a region where the electron temperature of the plasma is low (plasma diffusion region), and thus a large damage such as a recess in the wafer W does not occur. When a processing gas is introduced into a region where the electron temperature of the plasma is high (plasma excitation region), the processing gas is easily excited and dissociated. Meanwhile, when the processing gas is introduced into the region where the electron temperature of the plasma is low (plasma diffusion region), a degree of dissociating the processing gas may be lower than that supplied around the plasma excitation region.

The processing gas supplied from a gas supply source 50 is split by a splitter 51, and introduced into the processing container 2 via two supplying passages 52 and 53. In the plasma processing apparatus 1 according to the present embodiment, the gas supply source 50 includes an Ar gas supply unit 50a supplying an Ar gas, an HBr gas supply unit 50b supplying an HBr gas, and an $O_2$ gas supply unit 50c supplying an $O_2$ gas. A mixture gas of the Ar gas, the HBr gas, and the $O_2$ gas supplied from the Ar gas supply unit 50a, the HBr gas supply unit 50b, and the $O_2$ gas supply unit 50c is introduced into the processing container 2 as the processing gas.

A central introduction unit 55 for introducing the processing gas to a center portion of the wafer W is provided on a ceiling surface of the processing container 2. A peripheral introduction unit 56 for introducing the processing gas to a peripheral portion of the wafer W is provided on an inner side surface of the processing container 2. The central introduction unit 55 is disposed at a center of the ceiling surface of the processing container 2. One side of supply passage 52 that penetrates through the internal conductor 31 of the coaxial waveguide 30 is connected to the central introduction unit 55.

An injector block 57 for introducing the processing gas in the processing container 2 is attached to the central introduction unit 55. The injector block 57 is formed of, for example, a conductive material such as aluminum, and is electrically grounded. The injector block 57 is formed as a disc, and a plurality of gas ejection holes 58 penetrating the injector block 57 in an up-and-down direction thereof are provided in the injector block 57. The injector block 57 may be coated with, for example, alumina or Yttria.

As shown in FIG. 2, the injector block 57 is held at a space portion 59 formed as a cylinder at a center of the dielectric window 16. A gas reservoir unit 60 formed as a cylinder is formed between a lower surface of the internal conductor 31 of the coaxial waveguide 30 and an upper surface of the injector block 57 with an appropriate distance. The processing gas supplied from the supplying passage 52 that penetrates through the internal conductor 31 to the gas reservoir unit 60 is dispersed in the gas reservoir unit 60, and after that, is introduced into an upper portion of the center of the wafer W in the processing container 2 via the plurality of gas ejection holes 58 formed in the injector block 57.

The peripheral introduction unit 56 includes an injector ring 61 formed as a ring that surrounds an upper portion of the wafer W placed on the susceptor 3. The injector ring 61 is hollow, and the processing gas is supplied in the injector ring 61 through the supplying passage 53 that penetrates through the side surface of the processing container 2. A plurality of openings 62 are provided in an inner side surface of the injector ring 61 at constant intervals. The processing gas supplied into the injector ring 61 from the supplying passage 53 that penetrates through the side surface of the processing container 2 is dispersed in the injector ring 61, and after that, is introduced to a peripheral upper portion of the wafer W in the processing container 2 via the plurality of openings 62 provided in the inner side surface of the injector ring 61. Otherwise, the injector ring 61 may not be provided. For example, supplying nozzles of the processing gas may be provided in the inner side surface of the processing container 2 at constant intervals.

The splitter 51, and the Ar gas supplying unit 50a, the HBr gas supplying unit 50b, and the O₂ gas supplying unit 50c of the gas supply source 50 are controlled by the controller 65. A ratio of the Ar gas supplied from the Ar gas supplying unit 50a to the splitter 51, a ratio of the HBr gas supplied from the HBr gas supplying unit 50b to the splitter 51, and a ratio of the O₂ gas supplied from the O₂ gas supplying unit 50c to the splitter 51 are determined by the control of the controller 64. Accordingly, composition of the processing gas introduced into the processing container 2 is determined. According to the control of the controller 65, flow rates of the processing gases that are split by the splitter 51 toward the two supplying passages 52 and 53 to be supplied to the central introduction unit 55 and the peripheral introduction unit 56 are determined. Therefore, a ratio between introducing amounts of the processing gas supplied from the central introduction unit 55 and the peripheral introduction unit 56 to the processing container 2 is determined.

When the processing gas is introduced from the central introduction unit 55 to the portion right under the dielectric window 16, it is easy to dissociate the processing gas since the electron temperature of the plasma is high. On the other hand, when the processing gas is introduced from the peripheral introduction unit 56 that is relatively far from the dielectric window 16, the dissociation of the processing gas may be restrained because the electron temperature of the plasma is low. Therefore, in order to obtain a desired level of dissociation state of the processing gas, the dissociation state may be easily controlled by adjusting an amount of the processing gas supplied from the central introduction unit 55 and an amount of the processing gas supplied from the peripheral introduction unit 56.

Next, operations of the plasma processing apparatus 1 of the above structure according to the embodiment of the present invention will be described. In the plasma processing apparatus 1 of the present embodiment, an example in which a poly-Si film on the surface of the wafer W is etched by using an example of the processing gas including the HBr gas will be described as follows.

As shown in FIG. 1, in the plasma processing apparatus 1 according to the present embodiment, the wafer W is carried into the processing container 2, and placed on the susceptor 3. The processing container 2 is decompressed by an exhaust performed through the exhaust pipe 11. In addition, a processing gas including the Ar gas, the HBr gas, and the O₂ gas is introduced from the gas supply source 50. In this case, a ratio of the Ar gas supplied from the Ar gas supplying unit 50a to the splitter 51, a ratio of the HBr gas supplied from the HBr gas supplying unit 50b to the splitter 51, and a ratio of the O₂ gas supplied from the O₂ gas supplying unit 50c to the splitter 51 are determined by the control of the controller 65, and accordingly, composition of the processing gas is determined. In addition, the processing gas having a predetermined composition mixed in the splitter 51 is introduced into the processing container 2.

The introduction of the processing gas into the processing container 2 is performed simultaneously from the central introduction unit 55 provided on the ceiling surface of the processing container 2 and from the peripheral introduction unit 56 provided on the inner side surface of the processing container 2, and thus the processing gas is introduced to both of the center portion and the peripheral portion of the wafer W. A ratio between the introducing amounts of the processing gas from the central introduction unit 55 and the processing gas from the peripheral introduction unit 56 is determined by the controller 65 such that the etching process may be performed uniformly on the entire surface of the wafer W. The controller 65 controls the splitter 51, and the processing gas is introduced into the processing container 2 from the central introduction unit 55 and the peripheral introduction unit 56 according to the determined ratio.

In addition, when the microwave supply apparatus 35 operates, an electric field is generated on a lower surface of the dielectric window 16, and then the processing gas becomes plasma. Also, the poly-Si film on the surface of the wafer W is etched by active species generated at this time. After performing the etching process for a predetermined time, the operation of the microwave supply apparatus 35 and the supply of the processing gas into the processing container 2 are stopped, and the wafer W is carried out of the processing container 2, then a series of plasma etching processes is finished.

However, in the plasma processing apparatus 1 described above, in order to improve etching uniformity of the poly-Si film on the surface of the wafer W, conventionally a ratio between the introducing amount of the processing gas from the central introduction unit 55 and the introducing amount of the processing gas from the peripheral introduction unit 56 is optimized. The controller 65 conventionally controls the ratio between the introducing amounts split by the splitter 51 to be constant during the plasma process. However, even when the ratio between the introducing amounts of the processing gas from the central introduction unit 55 and from the peripheral introduction unit 56 is optimized at high accuracy, the etching rates at the center portion and the peripheral portion on the surface of the wafer W are greatly different from each other, and thus, it is difficult to perform the etching process uniformly.

Figure 3:
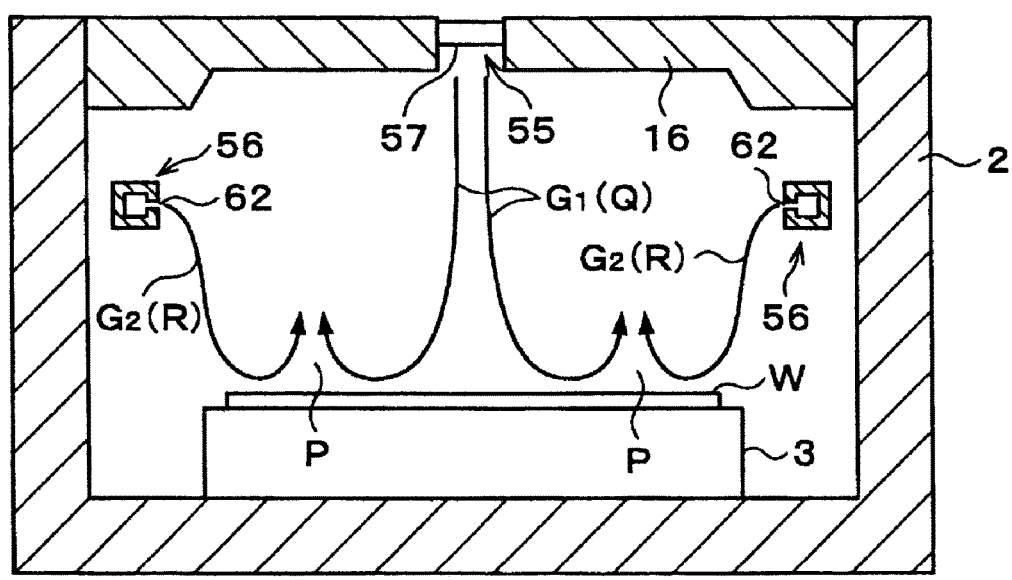
FIG. 3 is a diagram for describing a state where a processing gas is introduced into a plasma processing apparatus according to the conventional art.

Here, causes of the difference between the etching rates on the center portion and the peripheral portion of the surface of the wafer W when the processing gases are introduced from the central introduction unit 55 and the peripheral introduction unit 56 are examined. As shown in FIG. 3, conventionally, a ratio Q/R between an introducing amount Q of a processing gas G1 introduced from the central introduction unit 55 and an introducing amount R of a processing gas G2 introduced from the peripheral introduction unit 56 is constantly maintained by the control of the controller 65 during the plasma process. Thus, the processing gas G1 introduced from the central introduction unit 55 and the processing gas G2 introduced from the peripheral introduction unit 56 always collide with each other at a constant position P on the surface of the wafer W that is placed on the susceptor 3. Accordingly, settling down of the processing gas G1 and the processing gas G2 at the position P is expected. In addition, it is estimated that the settling down of the processing gas G1 and the processing gas G2 at the constant position P becomes the cause of the difference between the etching rates on the center portion and the peripheral portion of the surface of the wafer W.

Therefore, the present inventors tried to reduce the difference between the etching rates on the center portion and the peripheral portion of the surface of the wafer W by moving the position at which the processing gas is settled down during the plasma process by the control of the controller 65 on the surface of the wafer W. As denoted by solid lines in FIG. 4, the processing gas G1 is introduced from the central processing unit 55 at an introducing amount Q1 first, and the processing gas G2 is introduced from the peripheral introduction unit 56 at an introducing amount R1 (that is, the introducing amount ratio split by the splitter 51 is controlled at Q1/R1 by the controller 65). Here, the processing gas G1 introduced from the central introduction unit 55 and the processing gas G2 introduced from the peripheral introduction unit 56 collide with each other at a position P1 on the surface of the wafer W placed on the susceptor 3.

Figure 4:
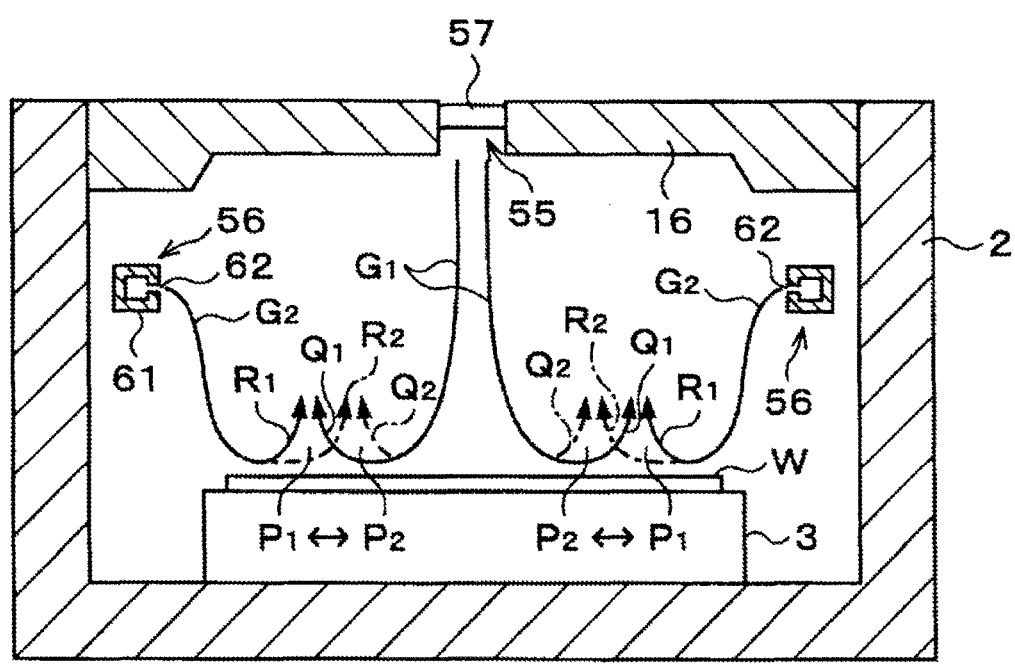
FIG. 4 is a diagram for describing a state where a processing gas is introduced into the plasma processing apparatus of FIG. 1.

Next, during continuing the plasma process, as denoted by dash-dot lines in FIG. 4, the processing gas G1 is introduced from the central introduction unit 55 at an introducing amount Q2 (Q2<Q1), and the processing gas G2 is introduced from the peripheral introduction unit 56 at an introducing amount R2 (R2>R1) (that is, the ratio between the introducing amounts split by the splitter 51 is controlled to be Q2/R2 by the controller 65). Here, the processing gas G1 introduced from the central introduction unit 55 and the processing gas G2 introduced from the peripheral introduction unit 56 collide with each other at a position P2 that is closer to the center of the wafer W than the position P1, on the surface of the wafer W placed on the susceptor 3.

In addition, during continuing the plasma process, the ratio between the introducing amounts split by the splitter 51 is controlled alternately between Q1/R1 and Q2/R2 by the controller 65, and thus a state where the processing gas G1 is introduced from the central introduction unit 55 at the introducing amount Q1 and the processing gas G2 is introduced from the peripheral introduction unit 56 at the introducing amount R1 (Q1/R1) and a state where the processing gas G1 is introduced from the central introduction unit 55 at the introducing amount Q2 and the processing gas G2 is introduced from the peripheral introduction unit 56 at the introducing amount R2 (Q2/R2) are alternately switched. As described above, by alternately changing the states of the introducing amount ratio Q1/R1 and Q2/R2, the position where the processing gas G1 and the processing gas G2 collide with each other on the surface of the wafer W may be alternately moved between the position P1 and the position P2.

From above result of the experiment, the present inventors obtained knowledge that the difference between the etching rates on the center portion and the peripheral portion of the surface of the wafer W may be reduced and thus uniform etching may be performed, by controlling the ratio between the introducing amounts split by the splitter 51 to be changed during the plasma process by using the controller 65, and changing the ratio between the introducing amount of the processing gas G1 from the central introduction unit 55 and the introducing amount of the processing gas G2 from the peripheral introduction unit 56 during the plasma process. Also, the experiment through which the present inventors obtain the above knowledge will be described later.

Therefore, according to the plasma processing apparatus 1 of the present embodiment, the ratio between the introducing amounts split by the splitter 51 is changed during the plasma process by the controller 65, and thus the uniformity of the plasma process on the surface of the wafer W may be improved. Accordingly, semiconductor devices having excellent performances may be manufactured.

Figure 5:
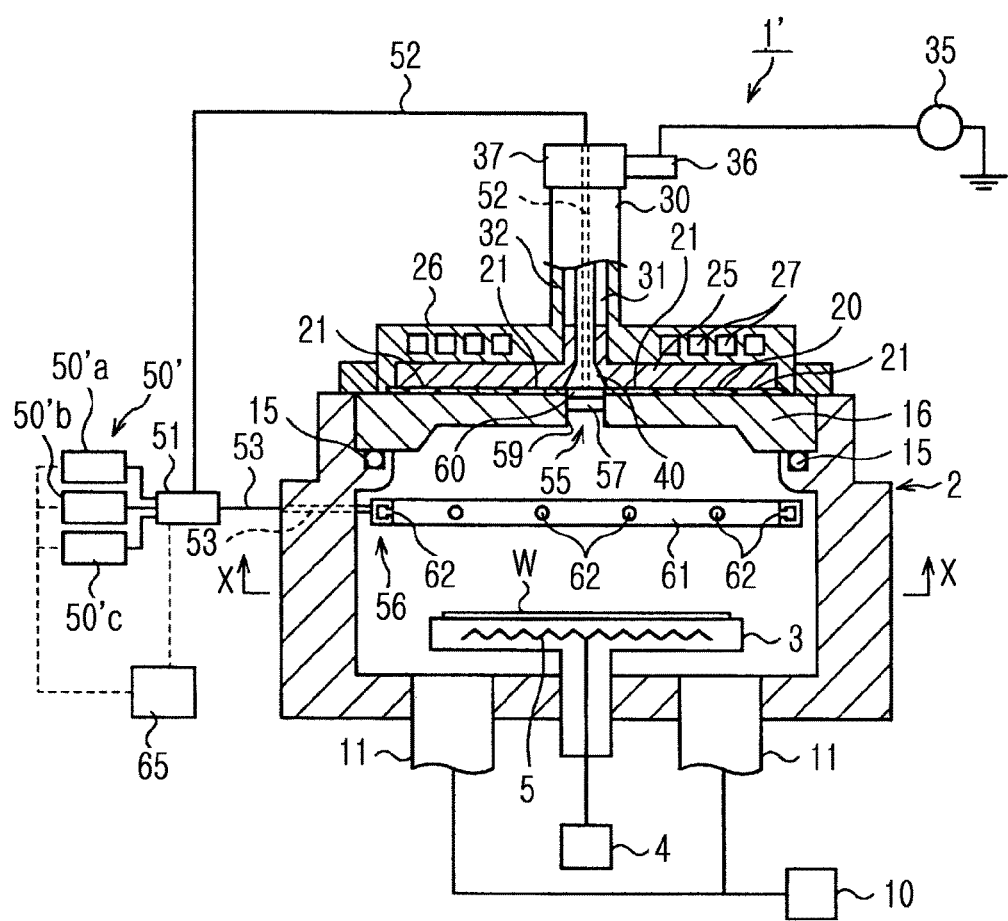
FIG. 5 is a longitudinal-sectional view schematically showing a plasma processing apparatus according to another embodiment of the present invention.

Next, a plasma processing apparatus 1' according to another embodiment of the present invention will be described. As shown in FIG. 5, in the plasma processing apparatus 1' according to the present embodiment, a gas supply source 50' includes an Ar gas supplying unit 50' a supplying an Ar gas, a $CF_4$ gas supplying unit 50' b supplying a $CF_4$ gas, and a $CHF_3$ gas supplying unit 50' c supplying a $CHF_3$ gas. A mixture gas of the Ar gas, the $CF_4$ gas, and the $CHF_3$ gas supplied from the Ar gas supplying unit 50' a, the $CF_4$ gas supplying unit 50' b, and the $CHF_3$ gas supplying unit 50' c is supplied into the processing container 2 as a processing gas. The plasma processing apparatus 1' of the present embodiment is substantially the same as the plasma processing apparatus 1 of the previous embodiment, except for that the kinds of the processing gases in the gas supply source 50 and in the gas supply source 50' are different from each other. Thus, descriptions about other components except for the gas supply source 50' are not provided here.

Next, operations of the plasma processing apparatus 1' of the present embodiment will be described. In addition, in the plasma processing apparatus 1' of the present embodiment, an example of etching an SiN film formed on the surface of the wafer W by using a processing gas including the $CF_4$ and the $CHF_3$ gas will be described as an example of the plasma process.

As shown in FIG. 5, in the plasma processing apparatus 1' of the present embodiment, the wafer W is carried into the processing container 2, and placed on the susceptor 3. In addition, inside of the processing container 2 is decompressed by the exhaustion of the exhaust pipe 11. Also, the processing gas including the Ar gas, the $CF_4$ gas, and the $CHF_3$ gas is introduced from the gas supply source 50'. In this case, a ratio of the Ar gas supplied from the Ar gas supplying unit 50' a to the splitter 41, a ratio of the $CF_4$ gas supplied from the $CF_4$ gas supplying unit 50' b to the splitter 51, and a ratio of the $CHF_3$ supplying unit 50' c to the splitter 51 are determined by the control of the controller 65 so as to determine a mixture ratio of each of material gases (Ar gas, $CF_4$ gas, and $CHF_3$ gas) in the processing gas. In addition, the processing gas mixed in the splitter 51 is introduced into the processing container 2.

The introducing of the processing gas into the processing container 2 is performed simultaneously from the central introduction unit 55 provided on the ceiling surface of the processing container 2 and the peripheral introduction unit 56 provided on the inner side surface of the processing container 2, and thus the processing gas is introduced to both of the center portion and the peripheral portion of the wafer W. A ratio between the introducing amount of the processing gas from the central introduction unit 55 and the introducing amount of the processing gas from the peripheral introduction unit 56 is determined when the controller 65 controls the splitter 51, and the ratio between the introducing amounts split by the splitter 51 is adjusted such that the etching process may be performed throughout the entire surface of the wafer W uniformly.

In addition, an electric field is generated on the lower surface of the dielectric window 16 by the operation of the microwave supply apparatus 35, and then the processing gas becomes plasma. The SiN film on the surface of the wafer W is etched by active species generated at this time. After performing the etching process for a predetermined time, the operation of the microwave supply apparatus 35 and the supply of the processing gas into the processing container 2 are stopped, and the wafer W is carried out of the processing container 2. Then, a series of plasma etching processes is finished.

However, in the plasma processing apparatus 1' of the present embodiment described above, it is required to accurately control a critical dimension (CD) of the etching in order to form recent ultra-fine patterns. Meanwhile, according to the knowledge of the present inventors, when the mixture ratio of the $CF_4$ gas and the $CHF_3$ gas in the processing gas that is introduced to the processing container 2 and becomes plasma is changed, the CD of the SiN film on the surface of the wafer W, which is etched, is changed. Also, an experiment through which the present inventor obtained the knowledge will be described later.

Thus, in the plasma processing apparatus 1' of the present embodiment, a supplying amount of the $CF_4$ gas supplied from the $CF_4$ gas supplying unit 50' b to the splitter 51, and a supplying amount of the $CHF_3$ gas supplied from the $CHF_3$ gas supplying unit 50' c to the splitter 51 are adjusted by the controller 65 to change the mixture ratio of the $CF_4$ gas and the $CHF_3$ gas in the processing gas, and thus the CD of the SiN film on the surface of the wafer W is controlled. Thus, the CD of the SiN film on the surface of the wafer W is easily controlled. Accordingly, the etching processes requiring a strict CD control such as processes of forming a mask opening, a spacer, or a gate may be easily performed.

In the plasma processing apparatus 1' of the present embodiment, the controller 65 may control the ratio between the introducing amounts split by the splitter 51 to be changed during the plasma process, and the ratio between the introducing amount of the processing gas G1 from the central introduction unit 55 and the introducing amount of the processing gas G2 from the peripheral introduction unit 56 is changed during the plasma process. Thus, the difference between the etching rates at the center portion and the peripheral portion on the surface of the wafer W is reduced, and the etching may be performed uniformly. Accordingly, semiconductor devices having excellent performances may be manufactured.

As described above, examples of the embodiments of the present invention are described; however, the present invention is not limited to the above examples. Those who skilled in the art would appreciate that any modified examples that do not depart from the spirit and technical scope of the present invention are included in the scope of the present invention.

In the above described embodiments, the present invention is applied to the plasma processing apparatus 1 or 1' performing the etching process; however, the present invention may be also applied to a plasma processing apparatus performing other substrate processes, such as a film-forming process, besides the etching process.

In the above described embodiments, an example where the poly-Si film on the surface of the wafer W is etched by using the processing gas including the HBr gas and an example where the SiN film on the surface of the wafer W is etched by using the processing gas including the $CF_4$ gas and the $CHF_3$ gas as source gases are described; however, the present invention may be applied to an etching process using another processing gas including other source gases besides the HBr gas, the $CF_4$ gas, and the $CHF_2$ gas. In addition, an object to be etched is not limited to the poly-Si film and the SiN film. In addition, the present invention is not limited to a plasma etching apparatus of an RLSA type, and may be applied to another ECR type plasma etching apparatus. In addition, a substrate processed in the plasma processing apparatus of the present invention may be any of a semiconductor wafer, an organic electroluminescence (EL) substrate, and a substrate for a flat panel display (FPD).

Embodiment 1

A difference between the etching rates at the center portion and the peripheral portion on the surface of the wafer W was considered with respect to the ratio between the introducing amounts split by the splitter 51. In addition, a Si wafer having a diameter of 300 mm was used, and a poly-Si film formed on the surface of the wafer W was etched.

COMPARATIVE EXAMPLES 1 THROUGH 3

Tables 1 through 3 respectively show processing conditions in comparative examples 1 through 3. In the comparative examples 1 through 3, the ratio between the introducing amounts split by the splitter 51 was constantly maintained during the plasma process, and an etching process Poly for removing the poly-Si film was performed for 30 seconds. During the etching process Poly, a ratio between the introducing amount of the processing gas G1 from the central introduction unit 55 and the introducing amount of the processing gas G2 from the peripheral introduction unit 56 was maintained at 25/75 in the comparative example 1, at 32/68 in the comparative example 2, and at 40/60 in the comparative example 3. In addition, when initiating the etching process, a breakthrough process BT for removing an oxide film formed on the surface of the wafer W was performed for 7 seconds, and after that, the etching process Poly was performed.

TABLE 1

| | Ar | HBr | $O_2$ | Pressure | Introducing amount ratio | MW | RF | Time |
|---|---|---|---|---|---|---|---|---|
| BT | 250 sccm | 150 sccm | | 10 mTorr | 40/60 | 2500 MHz | 150 MHz | 7 sec |
| Poly | 1000 sccm | 600 sccm | 8 sccm | 100 mTorr | 25/75 | 2500 MHz | 200 MHz | 30 sec |

TABLE 2

| | Ar | HBr | $O_2$ | Pressure | Introducing amount ratio | MW | RF | Time |
|---|---|---|---|---|---|---|---|---|
| BT | 250 sccm | 150 sccm | | 10 mTorr | 40/60 | 2500 MHz | 150 MHz | 7 sec |
| Poly | 1000 sccm | 600 sccm | 8 sccm | 100 mTorr | 32/68 | 2500 MHz | 200 MHz | 30 sec |

TABLE 3

|      | Ar         | HBr        | $O_2$      | Pressure  | Introducing amount ratio | MW        | RF        | Time    |
|------|------------|------------|------------|-----------|--------------------------|-----------|-----------|---------|
| BT   | 250 sccm   | 150 sccm   |            | 10 mTorr  | 40/60                    | 2500 MHz  | 150 MHz   | 7 sec   |
| Poly | 1000 sccm  | 600 sccm   | 8 sccm     | 100 mTorr | 40/60                    | 2500 MHz  | 200 MHz   | 30 sec  |

(Embodiment 1)

Table 4 shows processing conditions of the embodiment 1. In the embodiment 1, when initiating the etching process, a breakthrough process BT was performed for 7 seconds in order to remove an oxide film formed on the surface of the wafer W. After that, an etching process Poly1 for removing a poly-Si film by introducing the processing gas G1 from the central introduction unit 55 and the processing gas G2 from the peripheral introduction unit G2 at a ratio of 25/75 for three seconds, and an etching process Poly2 for removing the poly-Si film by introducing the processing gas G1 from the central introduction unit 55 and the processing gas G2 from the peripheral introduction unit 56 at a ratio of 40/60 for three seconds were alternately and repeatedly performed five times.

TABLE 4

|       | Ar        | HBr      | $O_2$   | pressure  | Introducing amount ratio | MW       | RF      | Time  |
|-------|-----------|----------|---------|-----------|--------------------------|----------|---------|-------|
| BT    | 250 sccm  | 150 sccm |         | 10 mTorr  | 40/60                    | 2500 MHz | 150 MHz | 7 sec |
| Poly1 | 1000 sccm | 600 sccm | 8 sccm  | 100 mTorr | 25/75                    | 2500 MHz | 200 MHz | 3 sec |
| Poly2 | 1000 sccm | 600 sccm | 8 sccm  | 100 mTorr | 40/60                    | 2500 MHz | 200 MHz | 3 sec |
| Poly1 | 1000 sccm | 600 sccm | 8 sccm  | 100 mTorr | 25/75                    | 2500 MHz | 200 MHz | 3 sec |
| Poly2 | 1000 sccm | 600 sccm | 8 sccm  | 100 mTorr | 40/60                    | 2500 MHz | 200 MHz | 3 sec |
| Poly1 | 1000 sccm | 600 sccm | 8 sccm  | 100 mTorr | 25/75                    | 2500 MHz | 200 MHz | 3 sec |
| Poly2 | 1000 sccm | 600 sccm | 8 sccm  | 100 mTorr | 40/60                    | 2500 MHz | 200 MHz | 3 sec |
| Poly1 | 1000 sccm | 600 sccm | 8 sccm  | 100 mTorr | 25/75                    | 2500 MHz | 200 MHz | 3 sec |
| Poly2 | 1000 sccm | 600 sccm | 8 sccm  | 100 mTorr | 40/60                    | 2500 MHz | 200 MHz | 3 sec |
| Poly1 | 1000 sccm | 600 sccm | 8 sccm  | 100 mTorr | 25/75                    | 2500 MHz | 200 MHz | 3 sec |
| Poly2 | 1000 sccm | 600 sccm | 8 sccm  | 100 mTorr | 40/60                    | 2500 MHz | 200 MHz | 3 sec |

FIGS. 6 through 9 respectively show results of the comparative examples 1 through 3, and the embodiment 1. In FIGS. 6 through 9, transverse axes denote locations on the surface of the wafer W (0 denotes the center), and longitudinal axes denote etching rate (ER).

Comparative Example 1

Figure 6:
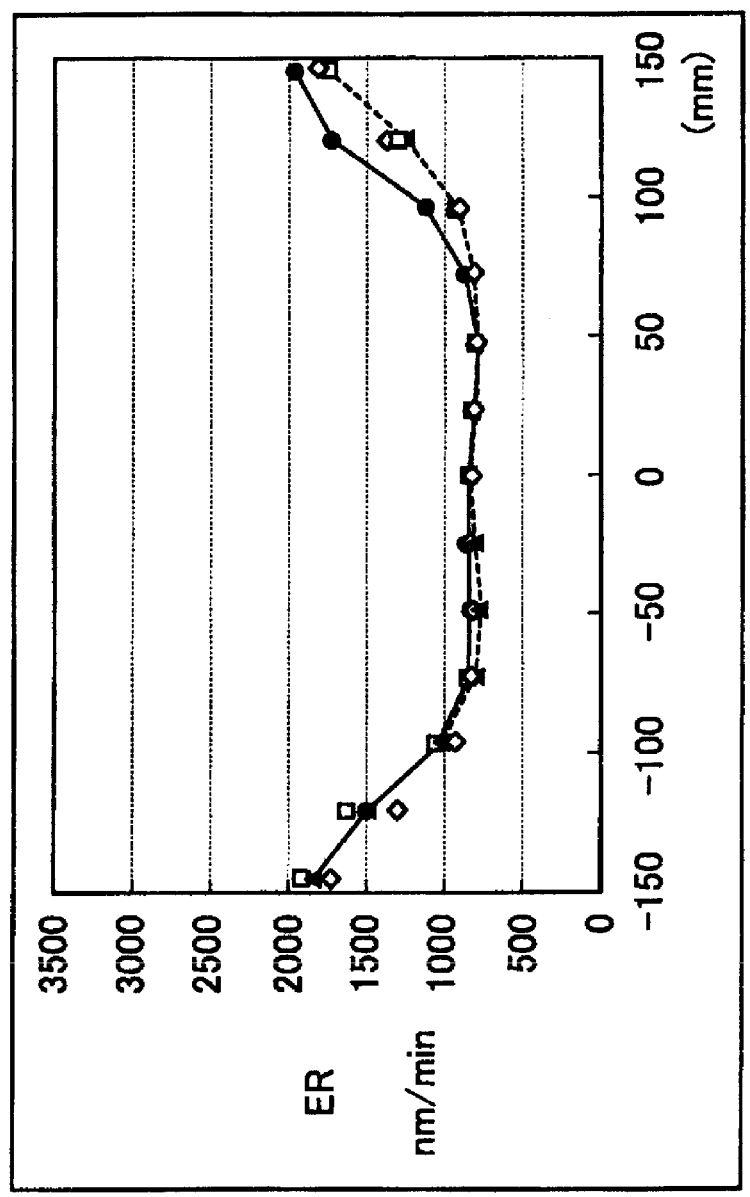
FIG. 6 is a graph showing distribution of etching rates according to a first comparative example.

As shown in FIG. 6, in the comparative example 1, the etching rate ER was greater at the peripheral portion of the wafer W, and was reduced at the center portion of the wafer W. Uniformity of the etching rate ER (average value of the etching rate ER±variation amount of the etching rate ER) was 121.0 nm/min±43.7%.

Comparative Example 2

Figure 7:
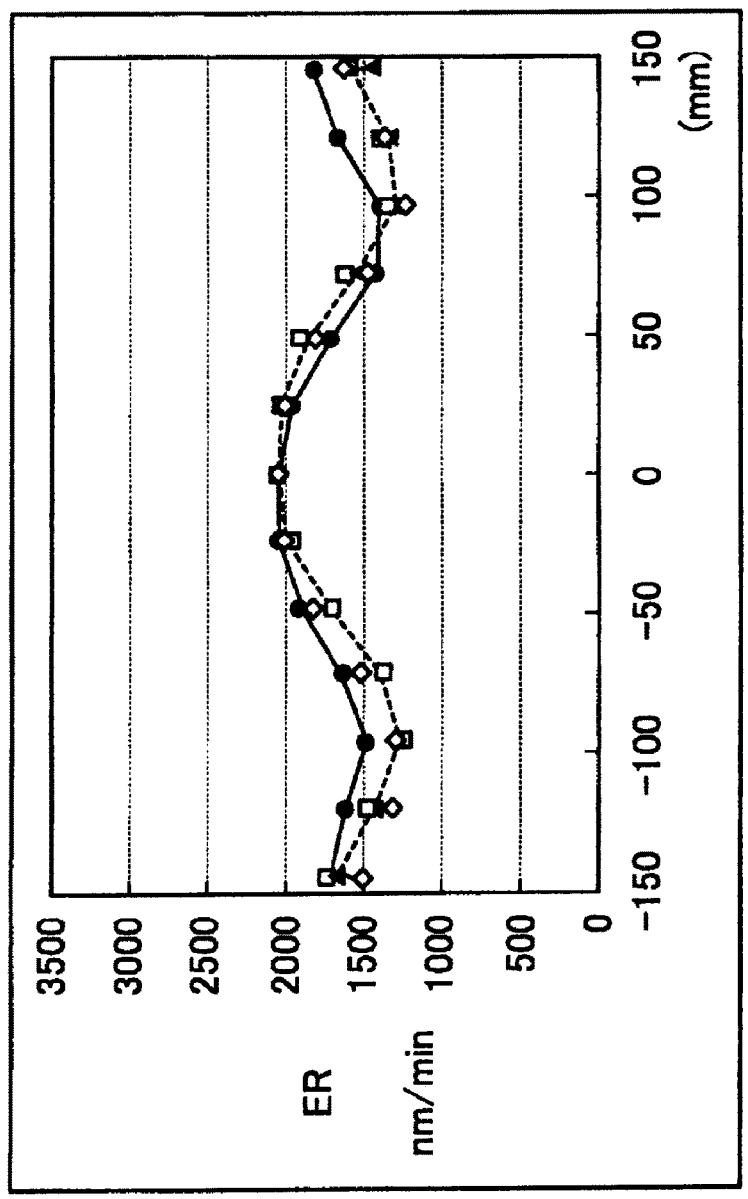
FIG. 7 is a graph showing distribution of etching rates according to a second comparative example.

As shown in FIG. 7, in the comparative example 2, the etching rate ER was greater at the center portion of the wafer W, and was minimized between the center portion and the peripheral portion of the wafer W. Uniformity of the etching rate ER (average value of the etching rate ER±variation amount of the etching rate ER) was 164.5 nm/min±25.0%.

Comparative Example 3

Figure 8:
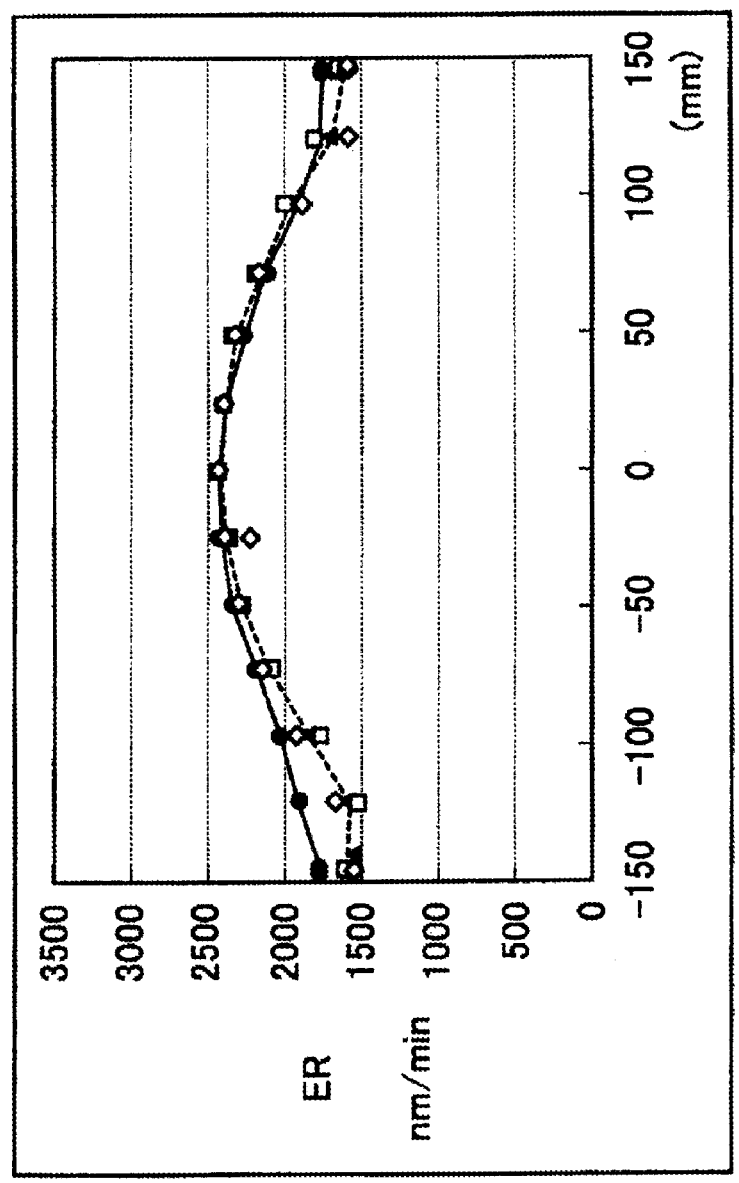
FIG. 8 is a graph showing distribution of etching rates according to a third comparative example.

As shown in FIG. 8, in the comparative example 3, the etching rate ER was greater at the center portion of the wafer W, and was reduced at the peripheral portion of the wafer W. Uniformity of the etching rate ER (average value of the etching rate ER±variation amount of the etching rate ER) was 198.2 nm/min±22.6%.

(Embodiment 1)

Figure 9:
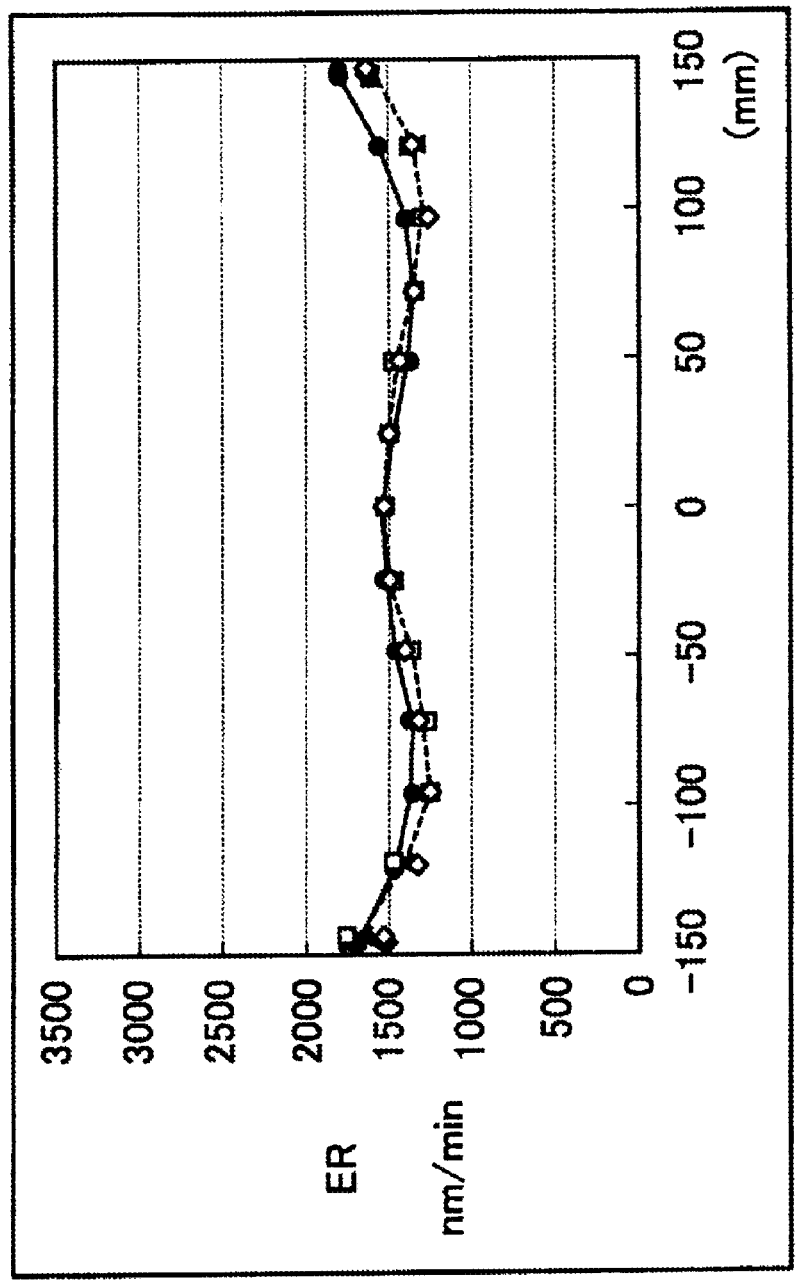
FIG. 9 is a graph showing distribution of etching rates according to the first embodiment of the present invention.

As shown in FIG. 9, in the embodiment 1, the etching rate ER was slightly greater at the peripheral portion of the wafer W; however, the etching rate ER was nearly uniform between the center portion and the peripheral portion of the wafer W. Uniformity of the etching rate ER (average value of the etching rate ER±variation amount of the etching rate ER) was 148.5 nm/min±18.1%. When comparing with the comparative examples 1 through 3, the variation amount of the etching rate ER of the embodiment 1 was the smallest.

Embodiment 2

Figure 10:
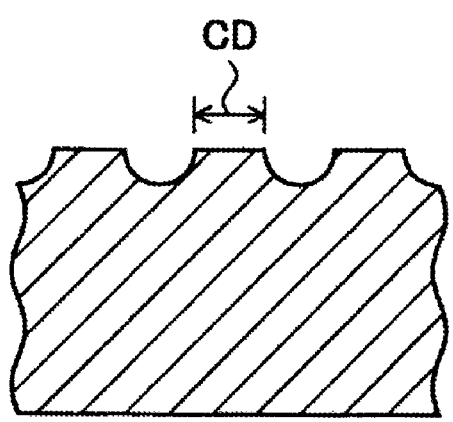
FIG. 10 is a partially magnified cross-sectional view showing an etched shape of a SiN film formed on a surface of a wafer according to the second embodiment of the present invention.

When a SiN film on the surface of the wafer W is etched by using a processing gas including a $CF_4$ gas and a $CHF_3$ gas as material gases, a relation between the mixture ratio of the $CF_4$ gas and the $CHF_3$ gas ($CF_4$ gas/$CHF_3$ gas) and the CD was examined. FIG. 10 shows an etched shape of the SiN film on the surface of the wafer W. Table 5 shows the relation between the mixture ratio of the $CF_4$ gas and the $CHF_3$ gas ($CF_4$ gas/$CHF_3$ gas) and the CD.

TABLE 5

| $CF_4$ gas/$CHF_3$ gas (sccm/sccm) | 120/240 | 150/210 | 180/180 | 240/120 |
|---|---|---|---|---|
| CD (nm) | 63 | 60 | 50 | 49 |

In the present embodiment, when the mixture ratio of the $CF_4$ gas and the $CHF_3$ gas ($CF_4/CHF_3$) is increased, the CD becomes smaller. From the result of the embodiment 2, it may be acknowledged that the CD during the etching process of the SiN film may be controlled by changing the mixture ratio of the $CF_4$ gas and the $CHF_3$ gas in the processing gas.

Embodiment 3

Figure 11A:
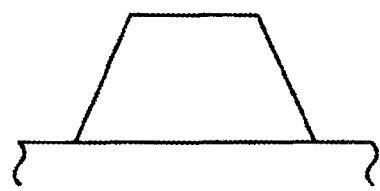
FIGS. 11A and 11B are partially magnified views showing etched shapes of an SiN film formed on a surface of a wafer, when an introducing amount of a processing gas on a central portion of the wafer is reduced and an introducing amount of a processing gas on a peripheral portion of the wafer is increased in plasma processing apparatus according to a third embodiment of the present invention.
Figure 11B:
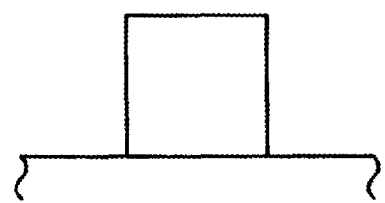
Figure 12A:
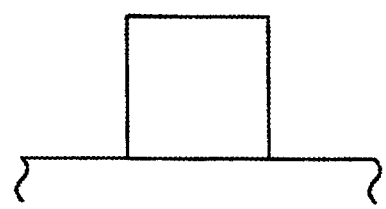
FIGS. 12A and 12B are partially magnified views showing etched shapes of an SiN film formed on a surface of a wafer, when an introducing amount of a processing gas on a central portion of the wafer is increased and an introducing amount of a processing gas on a peripheral portion of the wafer is reduced in the plasma processing apparatus according to the third embodiment of the present invention.
Figure 12B:
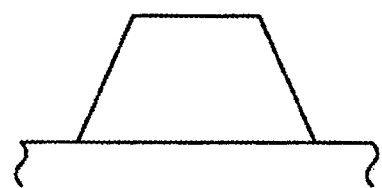

Next, influence of the ratio between the introducing amount of the processing gas (processing gas including the $CF_4$ gas and the $CHF_3$ gas as material gases) introduced at the center portion of the wafer W and the introducing amount of the processing gas introduced at the peripheral portion of the wafer W was examined. In addition, the mixture ratio ($CF_4/CHF_3$) of the processing gas introduced on the center portion of the wafer W and the processing gas introduced on the peripheral portion of the wafer W were the same as each other. As shown in FIG. 11, when the introducing amount of the processing gas onto the center portion of the wafer is less and the introducing amount of the processing gas onto the peripheral portion of the wafer is greater, the etched shape of the SiN film of the surface of the wafer at the center portion of the wafer has tapered shape in which a width of the SiN film is wider as the sides get near to a bottom portion thereof (a), and the SiN film of the surface of the wafer on the peripheral portion of the wafer was etched so as to have nearly perpendicular sides (b). Meanwhile, as shown in FIG. 12, when the introducing amount of the processing gas onto the center portion of the wafer is greater and the introducing amount of the processing gas onto the peripheral portion of the wafer is less, the SiN film of the surface of the wafer on the center portion of the wafer was etched so as to have nearly perpendicular sides (a), and the SiN film of the surface of the wafer on the peripheral portion of the wafer was etched to have tapered shape in which a width of the SiN film is wider as the sides get near to the bottom portion thereof (b).

From the results of the embodiments 2 and 3, it is acknowledged that the CD in the etching process of the SiN film may be controlled by changing the mixture ratio of the $CF_4$ gas and the $CHF_3$ gas in the processing gas, and the ratio between the introducing amounts of the processing gas introduced onto the center portion of the wafer and the processing gas introduced onto the peripheral portion of the wafer, thereby controlling the etched shape of the SiN film.

INDUSTRIAL APPLICABILITY

The present invention is advantageous in, for example, semiconductor manufacturing field.

What is claimed is:

1. A plasma processing apparatus which processes a substrate by generating plasma from a processing gas introduced in a processing container, the plasma processing apparatus comprising:
   a central introduction unit which introduces the processing gas onto a center portion of the substrate received in the processing container;
   a peripheral introduction unit which introduces the processing gas onto a peripheral portion of the substrate received in the processing container;
   a splitter which variably adjusts flow rates of the processing gas supplied to the central introduction unit and the peripheral introduction unit; and
   a controller configured to control the splitter during the plasma process to alternately and repeatedly switch a ratio of an introducing amount of the processing gas from the central introduction unit to an introducing amount of the processing gas from the peripheral introduction unit between a first introducing amount ratio and a second introducing amount ratio that is different from the first introducing amount ratio such that (i) when the ratio is the first introducing amount ratio, a colliding position of the processing gas introduced from the central introduction unit and the processing gas introduced from the peripheral introduction unit is formed at a first position on a surface of the substrate received in the processing container, (ii) when the ratio is the second introducing amount ratio, the colliding position of the processing gas introduced from the central introduction unit and the processing gas introduced from the peripheral introduction unit is formed at a second position on the surface of the substrate received in the processing container, and (iii) when the ratio is alternately and repeatedly switched between the first introducing amount ratio and the second introducing amount ratio, the colliding position is alternately and repeatedly switched between the first position and the second position.

2. The plasma processing apparatus of claim 1, wherein the central introduction unit is provided on a ceiling surface of the processing container, and the peripheral introduction unit is provided on an inner side surface of the processing container.

3. The plasma processing apparatus of claim 1, wherein the processing gas comprises HBr.

4. A plasma etching apparatus for etching a substrate by introducing a processing gas, in which a plurality of material gases are mixed, into a processing container and generating plasma from the processing gas in the processing container, the plasma etching apparatus comprising:
   a plurality of material gas supplying units which supply material gases that are different from each other;
   a central introduction unit which introduces the processing gas onto a center portion of the substrate received in the processing container;
   a peripheral introduction unit which introduces the processing gas onto a peripheral portion of the substrate received in the processing container;
   a splitter which variably adjusts flow rates of the processing gas supplied to the central introduction unit and the peripheral introduction unit; and
   a controller configured to control supplied amounts of the material gases from the material gas supplying units by controlling the splitter during a plasma etching process to alternately and repeatedly switch a ratio of an introducing amount of the processing gas from the central introduction unit to an introducing amount of the processing gas from the peripheral introduction unit between a first introducing amount ratio and a second introducing amount ratio that is different from the first introducing amount ratio such that (i) when the ratio is the first introducing amount ratio, a colliding position of the processing gas introduced from the central introduction unit and the processing gas introduced from the peripheral introduction unit is formed at a first position on a surface of the substrate received in the processing container, (ii) when the ratio is the second introducing amount ratio, the colliding position of the processing gas introduced from the central introduction unit and the processing gas introduced from the peripheral introduction unit is formed at a second position on the surface of the substrate received in the processing container, and (iii) when the ratio is alternately and repeatedly switched between the first introducing amount ratio and the second introducing amount ratio, the colliding position is alternately and repeatedly switched between the first position and the second position.

5. The plasma etching apparatus of claim 4, wherein the plurality of material gas supplying units comprise:
   a $CF_4$ gas supplying unit which supplies a $CF_4$ gas; and
   a $CHF_3$ gas supplying unit which supplies a $CHF_3$ gas,
   wherein the controller controls a supplying amount of the $CF_4$ gas from the $CF_4$ gas supplying unit and a supplying amount of the $CHF_3$ gas from the $CHF_3$ gas supplying unit.

* * * * *